United States Patent
Abdolvand et al.

(10) Patent No.: US 12,379,349 B2
(45) Date of Patent: Aug. 5, 2025

(54) ACOUSTOELECTRIC AMPLIFICATION IN RESONANT PIEZOELECTRIC-SEMICONDUCTOR CAVITIES

(71) Applicant: University of Central Florida Research Foundation, Inc., Orlando, FL (US)

(72) Inventors: Reza Abdolvand, Orlando, FL (US); Hakhamanesh Mansoorzare, Orlando, FL (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 0 days.

(21) Appl. No.: 18/490,329

(22) Filed: Oct. 19, 2023

(65) Prior Publication Data

US 2024/0044843 A1  Feb. 8, 2024

Related U.S. Application Data

(63) Continuation of application No. 16/933,098, filed on Jul. 20, 2020, now Pat. No. 11,821,872.

(60) Provisional application No. 62/876,268, filed on Jul. 19, 2019.

(51) Int. Cl.
  *H10N 30/85* (2023.01)
  *G01N 29/04* (2006.01)
  *H10N 30/87* (2023.01)

(52) U.S. Cl.
  CPC ........... *G01N 29/041* (2013.01); *H10N 30/87* (2023.02)

(58) Field of Classification Search
  CPC .................................................. G01N 29/041
  See application file for complete search history.

(56) References Cited

U.S. PATENT DOCUMENTS

| | | | |
|---|---|---|---|
| 9,590,587 B1* | 3/2017 | Thalmayr | H03H 9/059 |
| 2011/0298564 A1* | 12/2011 | Iwashita | H03H 9/173 333/187 |
| 2016/0099701 A1* | 4/2016 | Rinaldi | H03H 9/174 422/90 |
| 2018/0287047 A1* | 10/2018 | Rinaldi | H10N 30/40 |
| 2018/0287587 A1* | 10/2018 | Campanella Pineda | H03H 3/02 |
| 2019/0028086 A1* | 1/2019 | Takamine | H04B 1/0057 |

* cited by examiner

*Primary Examiner* — Bryan P Gordon
(74) *Attorney, Agent, or Firm* — Owen G. Behrens; Smith & Hopen, P.A.

(57) ABSTRACT

Interaction of acoustic waves in a piezoelectric-semiconductor resonant cavity with the charge carriers in the semiconductor layer can be directed toward amplification of the acoustic waves; such amplification scheme can be applied in building unilateral amplifiers, zero loss filters, oscillators, high detection range circuit-less wireless sensors, isolators, duplexers, circulators and other acoustic devices. An apparatus for acoustoelectric amplification is described. The apparatus includes a semiconductor layer and a thin piezoelectric layer bonded (or deposited) onto the semiconductor layer forming an acoustic cavity. Two or more tethers forming a current conduction path through the semiconductor layer and two or more access pads to silicon are positioned on two ends of the acoustic cavity and configured to inject a DC current in the semiconductor layer.

20 Claims, 10 Drawing Sheets

ACOUSTOELECTRIC AMPLIFICATION IN RESONANT PIEZOELECTRIC-SEMICONDUCTOR CAVITIES

CROSS-REFERENCE TO RELATED APPLICATIONS

This nonprovisional application is a continuation of and claims priority to U.S. patent application Ser. No. 16/933,098, entitled "ACOUSTOELECTRIC AMPLIFICATION IN RESONANT PIEZOELECTRIC-SEMICONDUCTOR CAVITIES", filed Jul. 20, 2020 by the same inventors, which claims priority to U.S. Provisional Patent Application No. 62/876,268, entitled "ACOUSTOELECTRIC AMPLIFICATION IN RESONANT PIEZOELECTRIC-SEMICONDUCTOR CAVITIES", filed Jul. 19, 2019 by the same inventors, all of which are incorporated herein by reference, in their entireties, for all purposes.

FEDERALLY SPONSORED RESEARCH OR DEVELOPMENT

This invention was made with Government support under Grant No. ECCS 1810143 awarded by the National Science Foundation (NSF). The government has certain rights in the invention.

BACKGROUND OF THE INVENTION

1. Field of the Invention

This invention relates, generally, to generally to acoustoelectric (hereinafter "AE") amplification systems, methods, devices and computer programs. More specifically, it relates to an AE amplification in lateral-extensional thin-film piezoelectric-on-silicon (hereinafter "TPoS").

2. Brief Description of the Prior Art

This section is intended to provide a background or context. The description may include concepts that may be pursued, but have not necessarily been previously conceived or pursued. Unless indicated otherwise, what is described in this section is not deemed prior art to the description and claims and is not admitted to be prior art by inclusion in this section.

The acoustoelectric effect and the associated amplification has been previously utilized in surface acoustic wave (SAW) devices which has limitations in terms of operation frequency (loosing efficiency at higher frequencies), low electromechanical coupling (very low efficiency).

Accordingly, what is needed is a new system that overcomes such limitations, as described above. However, in view of the art considered as a whole at the time the present invention was made, it was not obvious to those of ordinary skill in the field of this invention how the shortcomings of the prior art could be overcome.

SUMMARY OF THE INVENTION

The long-standing but heretofore unfulfilled need, stated above, is now met by a novel and non-obvious invention disclosed and claimed herein. In an aspect, the present disclosure pertains to an AE amplification in lateral-extensional thin-film piezoelectric-on-silicon (hereinafter "TPoS").

The above problems are overcome, and other advantages may be realized, by the use of the embodiments.

In a first aspect, an embodiment provides an apparatus for acoustoelectric amplification. The apparatus includes a semiconductor layer and a thin piezoelectric layer bonded or deposited onto the semiconductor layer forming an acoustic cavity. Two or more tethers forming a current conduction path through the semiconductor layer and two or more access pads to silicon are positioned on two ends of the acoustic cavity and configured to inject a DC current in the semiconductor layer.

In another aspect, an embodiment provides a further apparatus for acoustoelectric amplification. The apparatus includes a semiconductor layer having a current isolation trench defining a suspended filter structure. A thin piezoelectric layer is bonded or deposited onto the semiconductor layer and together they form an acoustic cavity within the suspended filter structure. The apparatus also includes pairs of interdigital transducers (hereinafter "IDT") configured to excite and detect radio frequency signals within the suspended filter structure. Two or more access pads to silicon are positioned on two ends of the acoustic cavity and are configured to inject a DC current in the semiconductor layer within the suspended filter structure.

Additional aspects and advantages of the present disclosure will become readily apparent to those skilled in this art from the following detailed description, wherein only illustrative embodiments of the present disclosure are shown and described. As will be realized, the present disclosure is capable of other and different embodiments, and its several details are capable of modifications in various obvious respects, all without departing from the disclosure. Accordingly, the drawings and description are to be regarded as illustrative in nature, and not restrictive.

The invention accordingly comprises the features of construction, combination of elements, and arrangement of parts that will be exemplified in the disclosure set forth hereinafter and the scope of the invention will be indicated in the claims.

BRIEF DESCRIPTION OF THE DRAWINGS

For a fuller understanding of the invention, reference should be made to the following detailed description, taken in connection with the accompanying drawings, in which.

DETAILED DESCRIPTION OF THE INVENTION

Figure 1:
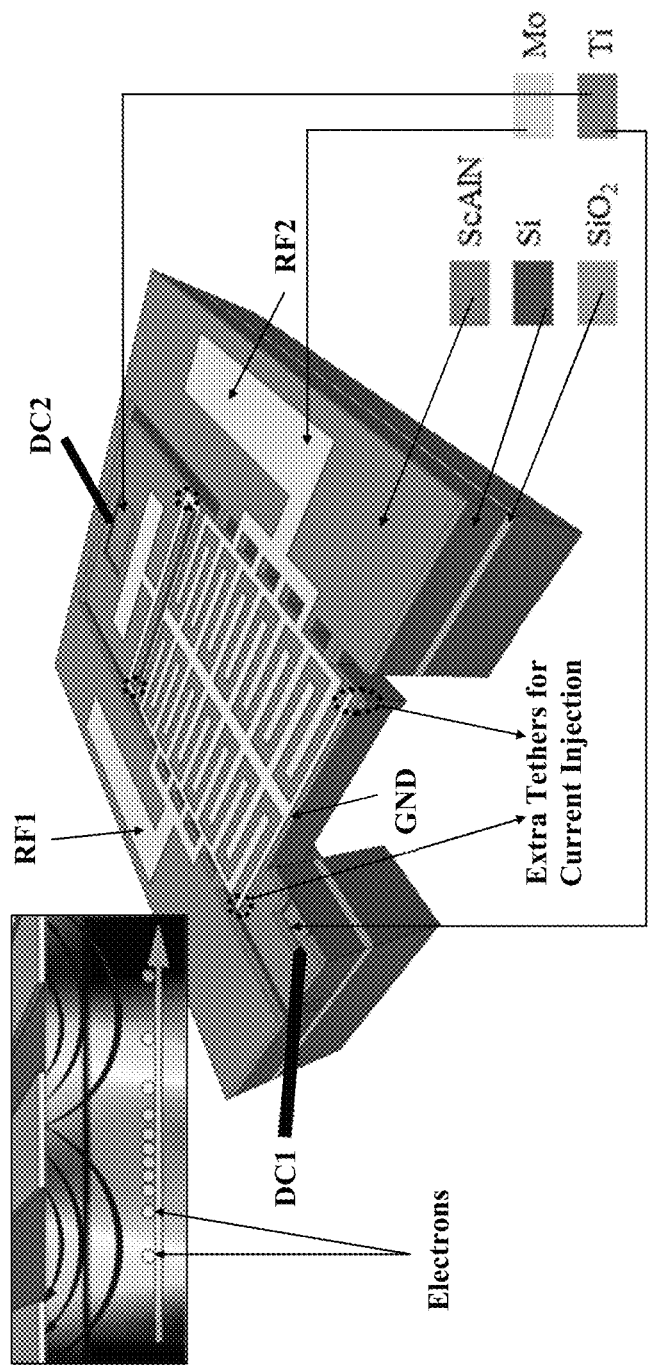
FIG. 1 depicts a schematic of the device shows the electrode configuration for lateral field excitation (hereinafter "LFE") as well as points of electrical contact to Si; inset visualizes AE interaction of piezoelectric field and electrons in the device, according to an embodiment of the present disclosure.

In the following detailed description of the preferred embodiments, reference is made to the accompanying drawings, which form a part thereof, and within which are shown by way of illustration specific embodiments by which the invention may be practiced. It is to be understood that one skilled in the art will recognize that other embodiments may be utilized, and it will be apparent to one skilled in the art that structural changes may be made without departing from the scope of the invention. Elements/components shown in diagrams are illustrative of exemplary embodiments of the disclosure and are meant to avoid obscuring the disclosure. Any headings, used herein, are for organizational purposes only and shall not be used to limit the scope of the description or the claims. Furthermore, the use of certain terms in various places in the specification, described herein, are for illustration and should not be construed as limiting.

Reference in the specification to "one embodiment," "preferred embodiment," "an embodiment," or "embodiments" means that a particular feature, structure, characteristic, or function described in connection with the embodiment is included in at least one embodiment of the disclosure and may be in more than one embodiment. The appearances of the phrases "in one embodiment," "in an embodiment," "in embodiments," "in alternative embodiments," "in an alternative embodiment," or "in some embodiments" in various places in the specification are not necessarily all referring to the same embodiment or embodiments. The terms "include," "including," "comprise," and "comprising" shall be understood to be open terms and any lists that follow are examples and not meant to be limited to the listed items.

Definitions

As used in this specification and the appended claims, the singular forms "a," "an," and "the" include plural referents unless the content clearly dictates otherwise. As used in this specification and the appended claims, the term "or" is generally employed in its sense including "and/or" unless the context clearly dictates otherwise.

In the following description, for the purposes of explanation, numerous specific details are set forth in order to provide a thorough understanding of embodiments of the present technology. It will be apparent, however, to one skilled in the art that embodiments of the present technology may be practiced without some of these specific details. The techniques introduced here can be embodied as special-purpose hardware (e.g. circuitry), as programmable circuitry appropriately programmed with software and/or firmware, or as a combination of special-purpose and programmable circuitry. Hence, embodiments may include a machine-readable medium having stored thereon instructions which may be used to program a computer (or other electronic devices) to perform a process. The machine-readable medium may include, but is not limited to, floppy diskettes, optical disks, compacts disc read-only memories (CD-ROMs), magneto-optical disks, ROMs, random access memories (RAMs), erasable programmable read-only memories (EPROMs), electrically erasable programmable read-only memories (EEPROMs), magnetic or optical cards, flash memory, or other type of media/machine-readable medium suitable for storing electronic instructions.

As used herein, the term "communicatively coupled" refers to any coupling mechanism configured to exchange information (e.g., at least one electrical signal) using methods and devices known in the art. Non-limiting examples of communicatively coupling may include Wi-Fi, Bluetooth, wired connections, wireless connection, quantum, and/or magnets. For ease of reference, the exemplary embodiment described herein refers to Wi-Fi and/or Bluetooth, but this description should not be interpreted as exclusionary of other electrical coupling mechanisms.

As used herein, the term "mechanical communication" refers to any coupling mechanism configured to transmit and/or transfer any force known in the art using any methods and/or device known in the art. Non-limiting examples of mechanical communication may include mechanical coupling, clamps, gear drives, gear shafts, drive shaft, universal joint, sleeve coupling, roller chain coupling, flange coupling, Oldham coupling, Split Muff coupling, and/or flange couplings. For ease of reference, the exemplary embodiment described herein refers to mechanical coupling, but this description should not be interpreted as exclusionary of other mechanical coupling mechanisms.

As used herein, the terms "about," "approximately," or "roughly" refer to being within an acceptable error range for the particular value as determined by one of ordinary skill in the art, which will depend in part on how the value is measured or determined (i.e., the limitations of a measurement system), (i.e., the degree of precision required for a particular purpose, such as acoustoelectric amplification in resonant piezoelectric-semiconductor cavities). As used herein, "about," "approximately," or "roughly" refer to within ±20% of the numerical.

All numerical designations, including ranges, are approximations which are varied up or down by increments of 1.0, 0.1, 0.01 or 0.001 as appropriate. It is to be understood, even if it is not always explicitly stated, that all numerical designations are preceded by the term "about". It is also to be understood, even if it is not always explicitly stated, that the compounds and structures described herein are merely exemplary and that equivalents of such are known in the art and can be substituted for the compounds and structures explicitly stated herein.

Wherever the term "at least," "greater than," or "greater than or equal to" precedes the first numerical value in a series of two or more numerical values, the term "at least," "greater than" or "greater than or equal to" applies to each of the numerical values in that series of numerical values. For example, greater than or equal to 1, 2, or 3 is equivalent to greater than or equal to 1, greater than or equal to 2, or greater than or equal to 3.

Wherever the term "no more than," "less than," or "less than or equal to" precedes the first numerical value in a series of two or more numerical values, the term "no more than," "less than" or "less than or equal to" applies to each of the numerical values in that series of numerical values. For example, less than or equal to 1, 2, or 3 is equivalent to less than or equal to 1, less than or equal to 2, or less than or equal to 3.

Lateral-Extensional Thin-Film Piezoelectric-on-Silicon AE Amplification

The present disclosure pertains to an AE amplification in lateral-extensional thin-film piezoelectric-on-silicon (hereinafter "TPoS").

Utilizing the AE effect in a piezoelectric-semiconductor resonant cavity can overcome the limitations in the conventional technology, in part, by amplifying bulk acoustic waves in a structure with high electromechanical coupling that was not feasible in the past and introduce a new paradigm for transistor-less amplification at both lower and higher frequencies and non-reciprocal devices.

The AE effect is the generation of electrical signal in response to acoustic wave (or vice versa). Amplification creates a higher signal amplitude, "gain". Resonant Cavities are structures that confine acoustic vibrations in the MHz-THz range (for RF applications) and the electrical and mechanical properties of the piezoelectric-semiconductor cavities can be tuned by independently choosing the proper materials that are employed in such devices.

Acoustic waves propagating in a piezoelectric medium are accompanied by a coupled electric field due to the piezoelectricity. In a thin piezoelectric film this field can penetrate into the surroundings and interact with charge carriers present within a certain distance. As a result, in a composite structure consisting of a thin layer of piezoelectric and semiconductor an energy exchange process exists between the propagating acoustic waves and the charge carriers in the semiconductor, from the former to the latter, leading to a loss mechanism called AE loss.

By pumping energy into the semiconductor layer through applying an electric field across it so that the velocity of charge carriers exceed that of the acoustic wave, energy transfer can be reversed (from the charge carriers to the acoustic waves) leading to the amplification of the acoustic waves. Such phenomenon can be employed in various devices and configurations that consist of a thin stack of piezoelectric layer on a semiconductor layer, including but not limited to TPoS (thin-film piezoelectric-on-Si) resonators, filters, delay lines, and/or oscillators. This is realized by placing (depositing or bonding) a layer of piezoelectric material in contact with a semiconductor substrate with proper doping concentration and forming the desired acoustic cavity and applying an electric field in parallel with the direction of acoustic wave propagation in the semiconductor layer. The described scheme can be used for building non-reciprocal amplifiers without utilizing active circuit components, near-zero insertion loss filters that eliminate the need for amplifier stages, oscillators, circuit-less quasi-passive wireless sensors with long detection range and duration of signal transmission, duplexers, isolators, and circulators. One of the more important features of the acoustoelectric amplification is that as the frequency of operation increases, the achievable gain increases too, exactly the opposite of amplification mechanism in transistor-based amplifiers where the gain-frequency product is limited.

Evidence for AE amplification in lateral-extensional TPoS resonant cavities is demonstrated. Due to the piezoelectric coupling, an evanescent electromagnetic wave is induced in the silicon (Si) layer that is a part of the resonant cavity, exchanging momentum with the carriers. Therefore, by injecting an electric current in this layer, the acoustic equivalent of Cherenkov radiation—AE amplification—can be realized. Such phenomenon is observed in a 1 GHz TPoS resonant cavity in which lateral field excitation (LFE) is utilized to excite the acoustic wave.

The acoustoelectric (AE) effect, a bi-directional coupling between the acoustic waves and electron flow (e.g., current) in a piezoelectric semiconductor (such as Cadmium Sulfide), fascinated a generation of physicists and engineers for decades during the 20th century. A major implication of the AE phenomena is AE amplification of traveling bulk acoustic waves (BAW)—and later pseudo-standing due to round-trip gain in acoustic masers—using an induced DC current.

This effect has a specific criterion over relative acoustic velocity and electron drift velocity. It turns out such a condition renders the AE amplification quite inefficient in common piezoelectric semiconductors. An alternate proposal places a high mobility semiconductor substrate adjacent to a good piezoelectric substrate such that the electric field associated with the acoustic wave traveling in the piezoelectric substrate penetrates into the semiconductor. As such, structures in which a semiconductor such as silicon (hereinafter "Si") is held in close proximity of a Lithium Niobate (hereinafter "LN") substrate where surface acoustic waves (hereinafter "SAW") are excited and detected were proposed, yielding limited success and efficiency.

The rise of gallium nitride (GaN) as a suitable candidate for high-electron mobility and power transistors, once more, invigorated research in AE interactions, leading to demonstration of gain in BAW GaN filters, for instance. Moderate carrier concentration—improving carrier mobility and reducing the adverse effect of carrier diffusion—and high electromechanical coupling are essential for AE gain. By separating the piezoelectric and semiconductor media, these two can be chosen and adjusted independently, improving the overall amplification performance. AE gain can be realized in thin-film piezoelectric-on-silicon (TPoS) resonant devices by injecting a DC current through the Si layer. High-order lateral-extensional TPoS resonant cavities operating at 1 GHz are chosen for proving the feasibility of this concept.

A stack of 1 µm (20%) scandium doped aluminum nitride ($Sc_{0.2}Al_{0.8}N$)—having twice the electromechanical coupling of pure AlN (0.4% herein) while being compatible with CMOS processing—sputtered on 2 µm of lightly doped n-type Si (in the order of 1E14 cm−3) forms the acoustic cavity. The electrode configuration for this resonant device is modified compared to the previous typical design as the bottom metal is removed to facilitate penetration of electric fields between the piezoelectric and the semiconductor layers, as shown in FIG. 1. Instead, the top metal layer is redesigned to enable lateral field excitation (LFE) of the harmonic lateral-extensional resonance mode at around 1 GHz. LFE is used to ensure the electric field due to the piezoelectricity in the ScAlN layer penetrates into the Si layer and exchanges momentum with the carriers within. Two extra pairs of tethers are added to the structure that form a current conduction path through the Si layer. Two access pads to silicon are also opened up on the two ends of the cavity through which a DC current is injected in the silicon. The DC contacts are isolated from the rest of the substrate to largely limit the current path through the resonant cavity.

FIG. 1 shows a schematic of the device showing the electrode configuration for LFE as well as points of electrical contact to Si as labeled by DC1 and DC2; inset conceptually visualizes AE interaction of piezoelectric field and electrons in the device. The device is fabricated on ScAlN on silicon on insulator substrate where the $SiO_2$ layer serves as the sacrificial layer for releasing the device. The interdigital transducers are made of Mo and the electrical contacts to Si are overlayed with Ti for improving electrical contact. The process for producing acoustoelectric amplification in lateral-extensional thin film piezoelectric-on-silicon (TPoS) resonant cavities is described below. Acoustic waves are excited by applying an RF signal between RF1 and GND, acoustoelectric gain is achieved by injecting a DC current (hereinafter "DC") through a Si layer and the acoustic signal ids detected byre adding the signal from RF2 and GND. Non-limiting example of potential products may include: unilateral amplifiers, zero loss filters, oscillators, high detection range circuit-less wireless sensors and/or any other acoustic wave devices known in the art (e.g., duplexers, circulators, isolators). A 0.23 dB gain has been realized with preliminary predictions showing a 50 dB gain possible.

In order to achieve an expression for the AE attenuation of composite resonant devices, the boundary condition corresponding to the set of equations for electric and elastic fields in both media are equated at their interface. This results in a dispersion equation for the system that can be modified and applied to standing wave devices as well to obtain the incremental gain due to AE effect:

$$\alpha = K^2 G \omega \left( \frac{\eta - 1}{(\eta - 1)^2 C^2 \left(1 + \frac{\omega^2}{\omega_C \omega_D}\right)^2} + \frac{\eta + 1}{(\eta + 1)^2 C^2 \left(1 + \frac{\omega^2}{\omega_C \omega_D}\right)^2} \right) \quad (1)$$

Here K is the electromechanical coupling, $\eta$ is the ratio of electron velocity ($V_e$) to acoustic velocity ($V_a$), $\omega_C = q\mu N/\varepsilon_{Si}$ and $\omega_D = qV^2/k_B T_\mu$ are the carrier relaxation and diffusion frequency respectively, $$G = \varepsilon_{Si} d \omega_C \left[\frac{tgh(\beta d)}{\beta d}\right] / 2\varepsilon_{ScAlN} V^2, \text{ and } C = q\mu N d \left[\frac{tgh(\beta d)}{\beta d}\right] / \varepsilon_{ScAlN} V_a$$

where d is thickness of the Si layer, N is the free carrier concentration, $\beta$ is the wave propagation constant, T is the temperature, $k_B$ is Boltzmann constant, and 1q is elementary charge. By separating the AE attenuation coefficient from the other sources of loss ($\alpha_{total} = \alpha_{other} + \alpha_{AE}$) the insertion loss (hereinafter "IL") can be written in the following form:

$$IL(dB) = 20\log_{10}\left(\frac{A_0 e^{-\alpha_{other} - \alpha_{AE}}(\cos(\omega t + \beta z) + \cos(\omega t - \beta z))}{A_0(\cos(\omega t + \beta z) + \cos(\omega t - \beta z))}\right) \quad (2)$$

Hence, the term due to the AE loss can be isolated so that the right side of the equation simplifies to sum of IL at no DC current and the electric gain due to the current injection in equation (3), as provided below:

$$20\log_{10}(e^{\alpha_{AE}}) + 20\log_{10}\left(\frac{A_0 e^{\alpha_{other}}(\cos(\omega t + \beta z) + \cos(\omega t - \beta z))}{A_0(\cos(\omega t + \beta z) + \cos(\omega t - \beta z))}\right) \quad (3)$$

Figure 2:
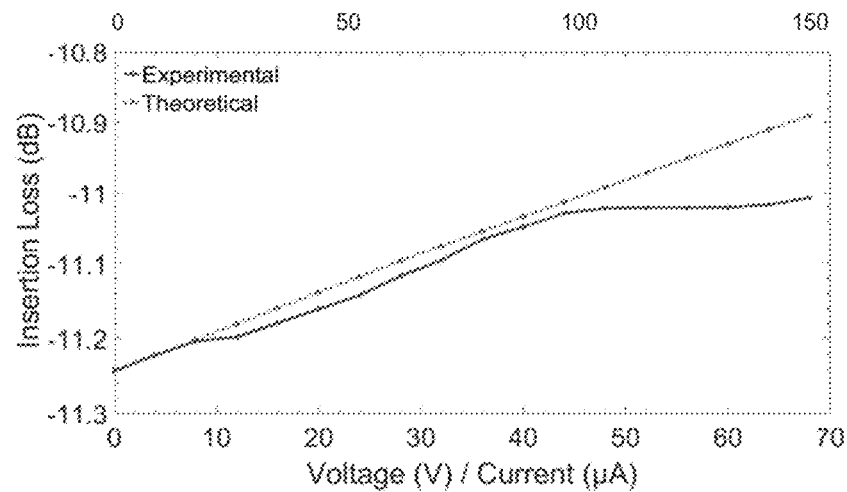
FIG. 2 depicts theoretical and experimental insertion loss (IL) of the targeted device for different voltages (bottom)/currents (top), according to an embodiment of the present disclosure.

By substituting the measured IL at no DC current in the right side term of equation (3) and the calculated electric gain from (1) in the left side term, the expected IL is derived and plotted in FIG. 2 for different applied voltages; the theoretical (connected by a dashed line) and experimental (connected by a solid line) IL of the targeted device for different voltages (bottom)/currents (top) are shown in FIG. 2.

Figure 3:
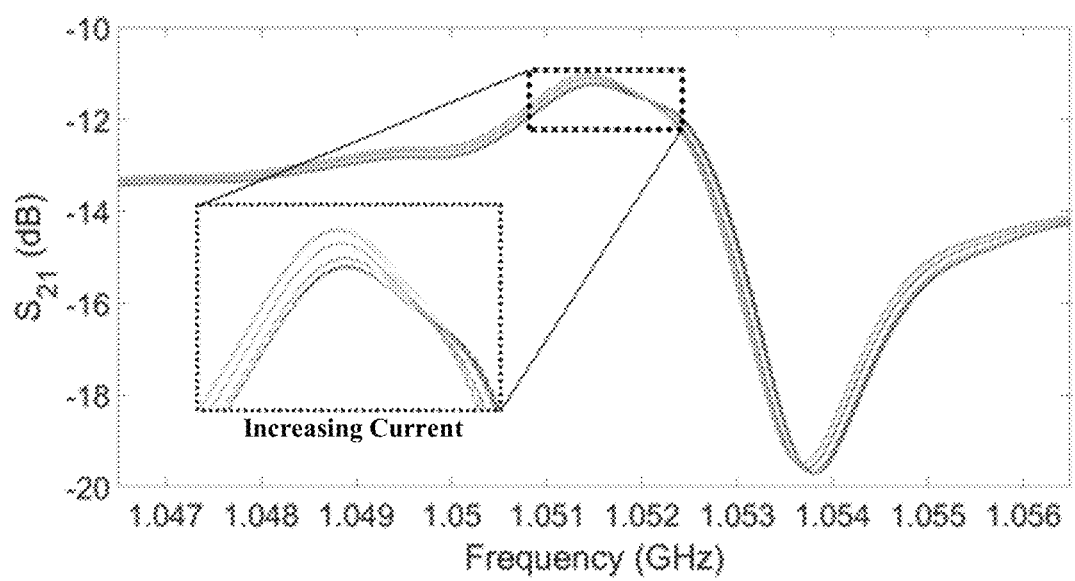
FIG. 3 depicts a frequency response of the device for different injected currents from 0 µA to 150 µA showing improvement in loss and quality factor (Q) as the current increases, according to an embodiment of the present disclosure.
Figure 4:
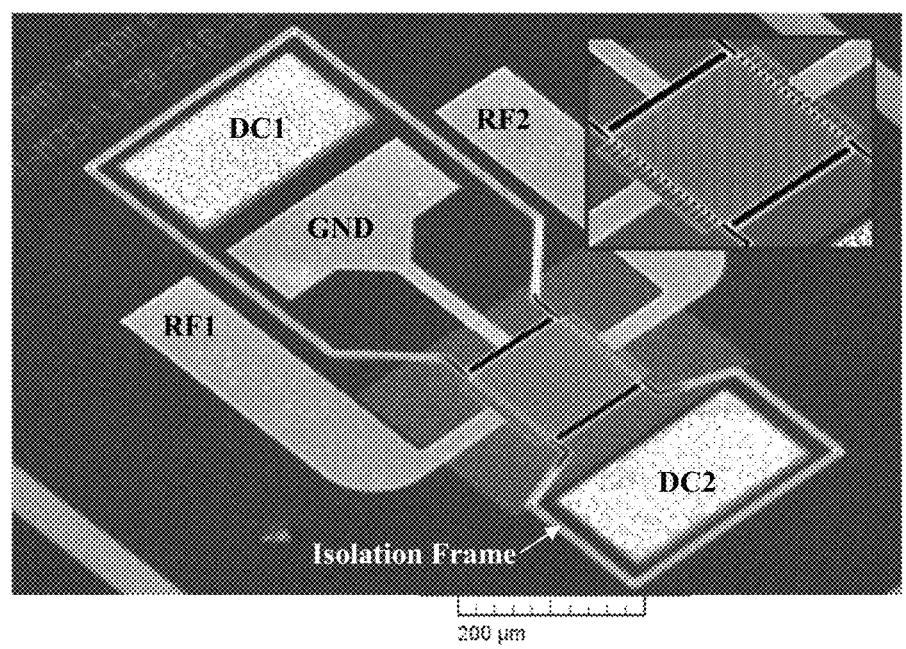
FIG. 4 is a scanning electron micrograph (SEM) picture of the device designed for AE amplification, according to an embodiment of the present disclosure.

While measuring the frequency response (e.g., S21) of the targeted device using a Rohde & Schwarz ZNB 8 network analyzer and a pair of Cascade Microtech GSG probes at room temperature in atmospheric pressure, a DC probe is used to apply a DC voltage across the pair of Si electrical contacts and injected current is measured. The average IL of the device as a function of the applied voltage is plotted in FIG. 2 (data points are connected by solid line), showing a 0.23 dB gain by passing a —150 µA current which is less than the 0.48 dB expected from the theory that can be possibly due to adverse effect of joule heating in the device. The frequency response of the resonator with increasing the current is plotted in FIG. 3 and the SEM picture of the device is shown in FIG. 4.

Using AE amplification in lateral-extensional TPoS overcomes issues with the transistor-based amplifiers available today which all suffer from the limited gain-frequency product meaning that as the frequency increases, the gain decreases and reaches zero. Acoustoelectric amplification mechanism, on the other hand, becomes more efficient and offers higher gains as the frequency increases. Filtering networks introduce attenuation to the signal and require additional amplifying stages with active components while a resonant filter functioning with this scheme can be tuned to introduce no loss to the signal or amplify the signal. Sensors that offer long detection range require being accompanied by active circuits that are size and cost ineffective. The circuit-less quasi passive sensors, however, offer long detection range and transmission duration with addition of a small battery. Non-reciprocal delay-lines with zero insertion-loss can be realized using such phenomenon.

High gain unilateral amplifiers, resonant filters with zero loss, self-amplifying filters and oscillators, and long-range non-complex sensors all can be realized and are crucial for today's communication devices, especially due to the trends of internet of things, miniaturization, closely spaced narrow communication bands, and low power consumption. For instance, various embodiments can potentially replace the power-hungry amplifier stages in communication networks while consuming a power in the range of 100 μW or less.

Amplifiers and filters that incorporate the acoustoelectric amplification have the potential to substitute the conventional transistor-based amplifiers that are widely used today in many different electrical devices. The fast-paced growth in the internet of things (IoT) sector requires cheap sensors with long detection ranges where the aforementioned sensors can perfectly fit in.

An embodiment provides an apparatus for acoustoelectric amplification. The apparatus includes a semiconductor layer and a thin piezoelectric layer deposited/bonded onto the semiconductor layer and forming an acoustic cavity. At least two tethers forming a current conduction path through the semiconductor layer are present. The apparatus also includes at least two access pads DC1 and DC2 disposed in a Titanium (hereinafter "Ti") region in the silicon and positioned on two ends of the acoustic cavity. These at least two access pads DC1 and DC2 are configured to inject a DC current in the semiconductor layer.

In a further embodiment of the apparatus above, the thin piezoelectric layer comprises 1 μm (20%) scandium doped aluminum nitride ($Sc_{0.2}Al_{0.8}N$), and the semiconductor layer comprises 2 μm of lightly doped n-type Si. The materials and thicknesses used are not limited to the aforementioned ones; Aluminum nitride (which can be scandium doped), lithium niobate, gallium nitride, etc. can be used as the piezoelectric layer, having a thickness of a few nano meters to a few microns. Additionally, the semiconductor layer can be Si, Ge, compound semiconductors such as III-V materials, graphene, etc., provided that they have the proper carrier concentration and mobility.

In another embodiment of any one of the apparatus above, the at least two access pads are configured to inject the DC current so as to apply an electric field in parallel with a direction of acoustic wave propagation in the semiconductor layer.

Further embodiments enable operation as MEMS filters and delay lines with more than −20 dB of nonreciprocity and −6 dB gain. This, for instance, can potentially be implemented in the radio frequency front ends (RFFE) as the fifth generation (5G) and beyond uses full-duplex communications, that is most efficiently achieved by non-reciprocal and adaptive filters and long but miniaturized and low-loss delays.

In the 5G and beyond era in telecommunications, a great number of issues rise up that are crucial to address. Among them are the limited available frequency spectrum for data communication, interference from the transceiver module (self-interference) and from the overly congested electromagnetic spectrum (external-interference). This is because 5G relies on a great number of transceivers and antennas in the close vicinity of one another along with the additional traffic due to the internet of things (IoT) to build the communication network as a whole. As a result, full-duplexed communication along with interference mitigation architectures are inevitable as it enables doubling the communication capacity through simultaneous transmission and receive at the same frequency. Such a scheme, however, mandates integration of non-reciprocal components which are currently unavailable as the current RFFE modules are entirely implemented based on inherently reciprocal platforms. While using ferromagnetic components, material nonlinearity, or some time varying electronic approaches have been suggested, they either suffer from miniaturization and integration issues, frequency conversion, high power consumption, or highly complex architectures (e.g., need for external clocks, switches, etc.).

Another area of interest is the tactical communications field that uses frequency selective limiters for non-reciprocal suppression of high power in-band signals that can saturate and disable the receivers, hence hindering the tactical connectivity. The possibility of miniaturized non-reciprocal components based on the AE effect may be used only a few milliwatts of power consumption which can potentially circumvent the above-mentioned issues and become a ubiquitous component in the novel communication architectures.

On the other hand, recently in the optoelectronics field, time-reversal symmetry has proven to be avoidable by employing the interaction between photons and acoustic phonons. This opens up possibilities of controlling the light propagation, achieving optical gain (laser and its bandwidth narrowing), microscopy, and material characterization. However, in order to achieve such, a high power laser is required to induce large acoustic vibrations in the structure which decreases the efficiency and practicality of this scheme. Through the AE interactions, electrons could assist in inducing larger vibrations and consequently relaxing the power requirements of the utilized laser.

A non-limiting embodiment provides a demonstration of bulk-mode lithium niobate-on-silicon (hereinafter "LNoSi") nonreciprocal transversal filters that exploit the acoustoelectric (hereinafter "AE") effect for signal amplification/attenuation. In these devices, a direct current is passed through the underlying Si layer to adjust the insertion loss (hereinafter "IL") and nonreciprocal transmission ratio (hereinafter "NTR") of the device. AE gains up to 5.6 dB with >20 dB NTR are obtainable by injecting 500 μA of current. This allows for merging filters, switches, and tunable attenuators in a miniaturized device which is a sought-after stepping stone for facilitating full-duplexed communications.

The AE effect, e.g., momentum exchange between electrons and acoustic phonons, ignited a great deal of research during the 20th century with the goal of developing surface acoustic wave (SAW) amplifiers and signal processors. However, success was limited by the existing fabrication capabilities, discouraging researchers from further investigations. The recent demonstrations of the AE effect, from the observation of a DC current associated with acoustic waves in epitaxial AlGaN/GaN delay lines to a gain in LN/semiconductor SAW structures, is due to the advances in thin film growth and bonding techniques. Here, such effect is utilized to demonstrate bulk-mode LNoSi transversal filters with large tunable gains and nonreciprocity.

Figure 5:
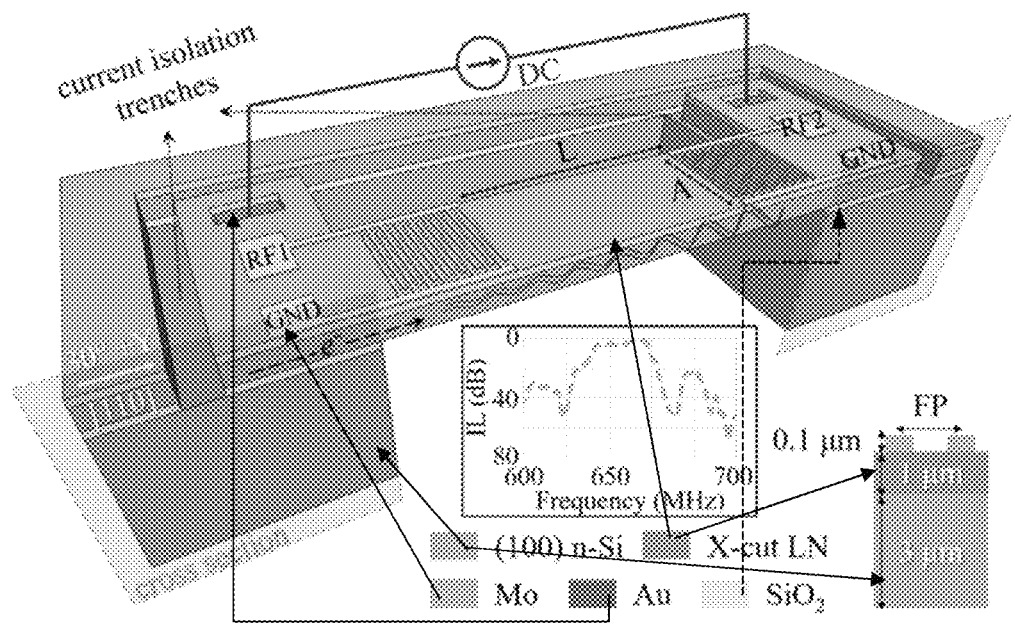
FIG. 5 depicts a schematic of an embodiment having a stack cross-section and FEA simulated frequency response, according to an embodiment of the present disclosure.

To satisfy the requirements for maximum AE coupling, e.g., high electromechanical coupling and low concentration of high-mobility electrons, an X-cut LN wafer is directly bonded to slightly (~7E14 $cm^{-3}$) n-typed doped (100) SOI wafer where the $SiO_2$ layer acts as the sacrificial layer for releasing the device and forming the suspended structure. The wafers are oriented so that the 30° off +y-axis plan of LN (that offers the highest coupling for symmetric Lamb waves) is aligned to the [110] SI plane, as shown in FIG. 5. Twenty (20) pairs of interdigital transducers (hereinafter "IDT") at the two ports RF1 and RF2 (respectively defined by RF1 and GND and RF2 and GND pairs) allow for lateral-field excitation/detection of RF signal as the bottom electrode is avoided to promote AE interactions. The IDT is made of Mo and its finger pitch (hereinafter "FP") determines the center of the pass-band. The lateral boundary of the suspended filter (labeled by L and A) is defined by etching the device stack. This also restricts the current to pass through only the underlying Si body upon biasing the Au overlaid openings of Si. The RF signal can be amplified (or attenuated) form one port RF1, RF2 to another depending on the intensity and the direction of electron drift with respect to the traveling acoustic waves, resulting in nonreciprocity and switchability.

Figure 6:
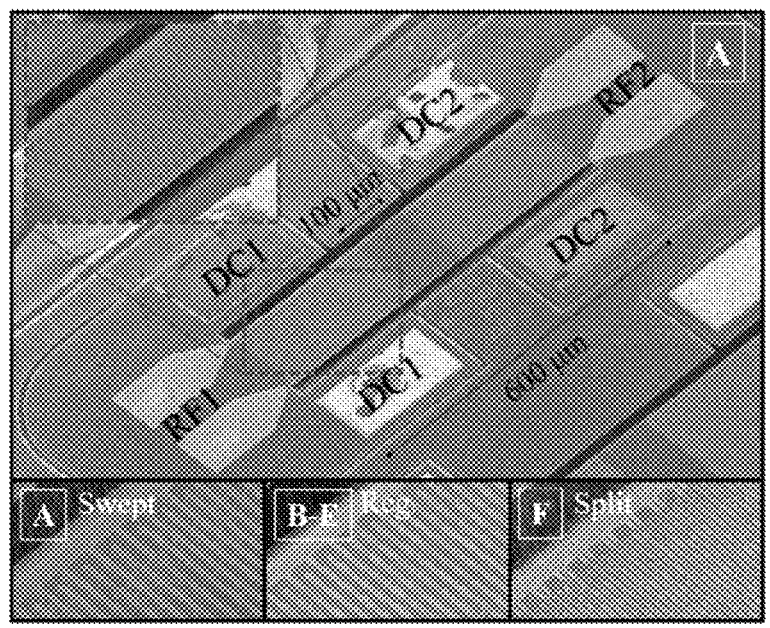
FIG. 6 depicts a SEM of an A-type filter and other IDT designs, according to an embodiment of the present disclosure.

TABLE 1, as provided below, summarizes the design parameters, IL, and fractional bandwidth (hereinafter "FBW") of the filters. The effect of device length (hereinafter "L"), aperture (hereinafter "A"), and electrode configuration (e.g., bidirectional or regular, split, and linearly swept FP) are studied. The SEM of an A-type filter and all the electrode configurations are shown in FIG. 6.

TABLE 1

| Device Type | A | B | V | D | E | F |
|---|---|---|---|---|---|---|
| IDT Type | Swept | Reg. | Reg. | Reg. | Reg. | Split |
| L (μm) | 100 | 200 | 200 | 400 | 400 | 400 |
| A (μm) | 150 | 150 | 200 | 150 | 200 | 150 |
| FP (μm) | 5 to 6 | 5 | 5 | 5 | 5 | 5 |
| IL (dB) | 15.4 | 16.5 | 17.3 | 19.3 | 21.6 | 25.8 |
| FBW (%) | 2.8 | 2.1 | 2.3 | 1.6 | 1.9 | 2.7 |

Figure 7:
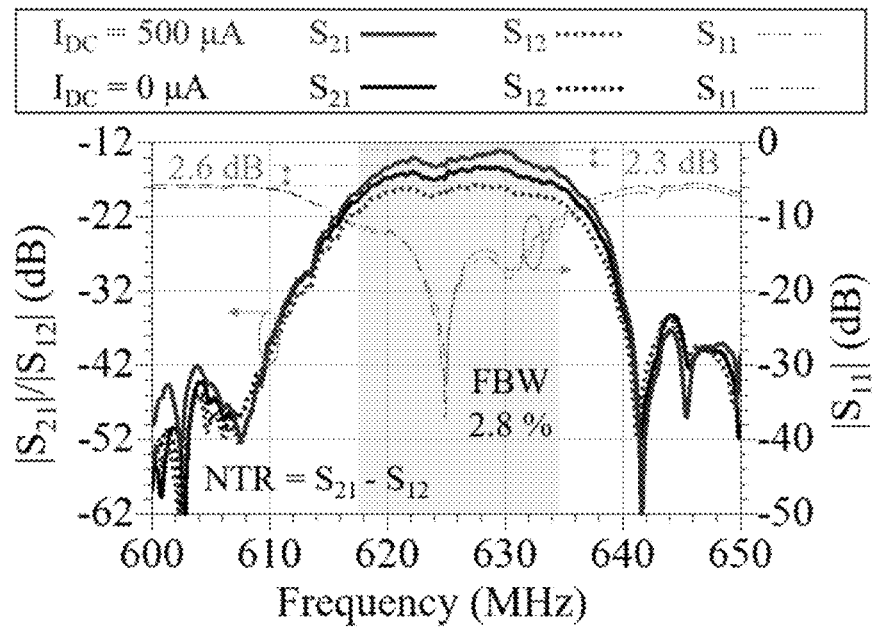
FIG. 7 depicts demonstrates a measured frequency response of an A-type filter before and after passing 500 μA of current, according to an embodiment of the present disclosure.
Figure 8:
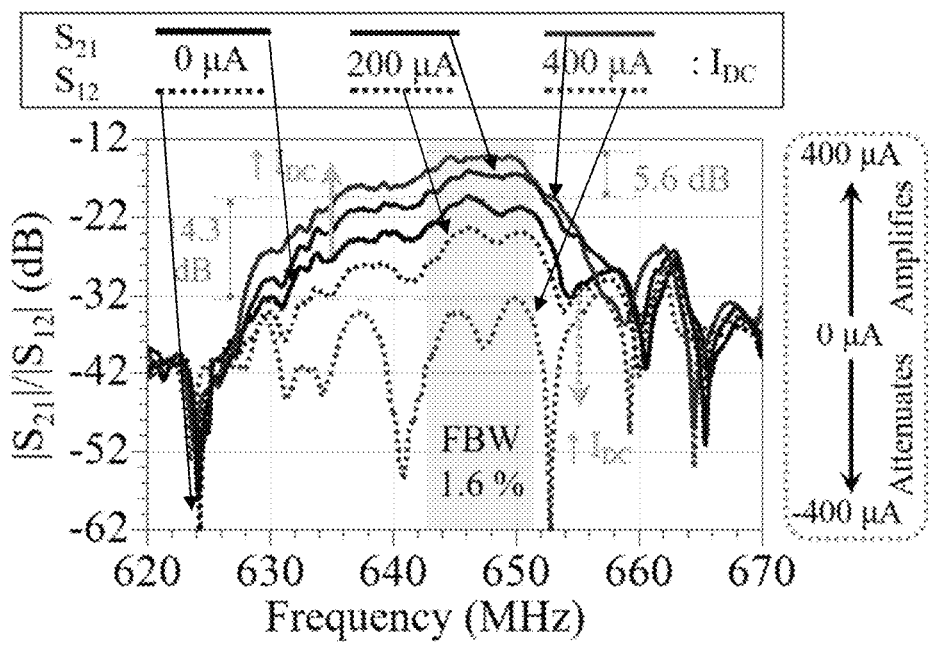
FIG. 8 depicts demonstrates a measured frequency response of $S_{21}(S_{12})$ [shown in solid(dashed)] of a D-type filter for a 0 to 400 μA current sweep, displaying the switchablity of the device, according to an embodiment of the present disclosure.
Figure 9:
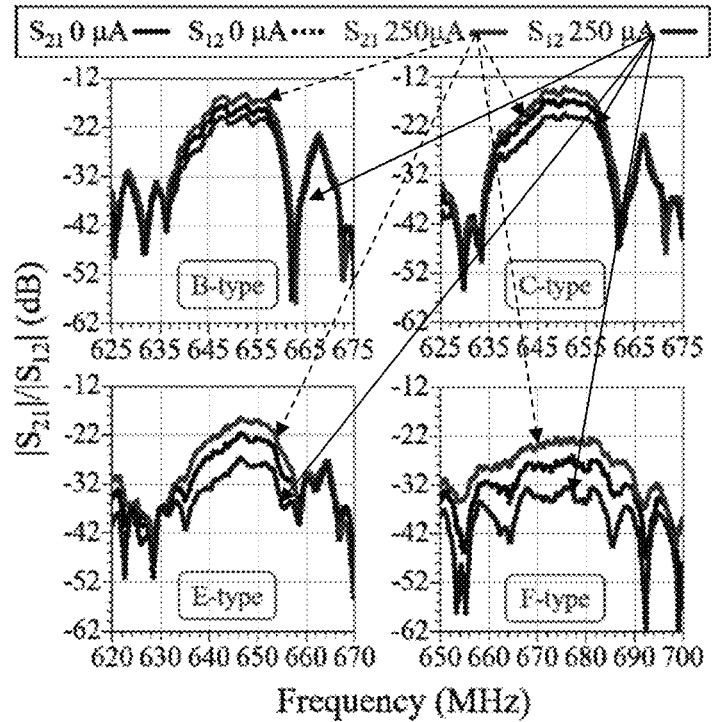
FIG. 9 depicts a measured transmission/isolation response of four (4) other types of the filters, according to an embodiment of the present disclosure.
Figure 10:
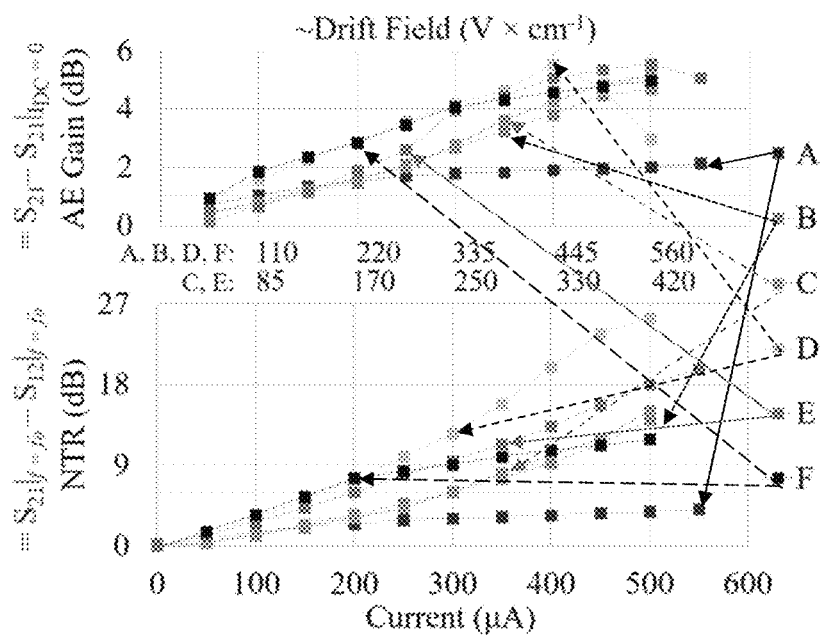
FIG. 10 illustrates a summary of the measured AE gain and NTR of the filters as a function of current (and applied drift field) showing NTRs more than 20 dB, according to an embodiment of the present disclosure.

The filters are characterized at normal temperature and pressure (NTP) by a VNA and calibrated GSG probes while a controlled current is injected through the filters with DC probes. The RF characteristic of an A-type filter before (black) and after (grey) passing a 500 μA current is shown in FIG. 7. The IL and reverse isolation are enhanced and an NTR of 4.9 dB is achieved. The same for a D-type filter for a current sweep from 0 to 400 μA is shown in FIG. 8. While the FBW is smaller than that of the A-type, a 5.6 dB gain and 19.9 dB NTR is achieved, virtually turning off the reverse transmission. The S21/S12 of all the other filters and the summary of the measured AE gains and NTRs are shown in FIG. 9 and FIG. 10, respectively. The results presented high AE gain can be achieved in bulk-mode AE devices with much lower power consumption compared to the recent SAW counterparts. This suggests the possibility of developing fully-switchable near-zero IL filters through further design optimizations.

Figure 18:
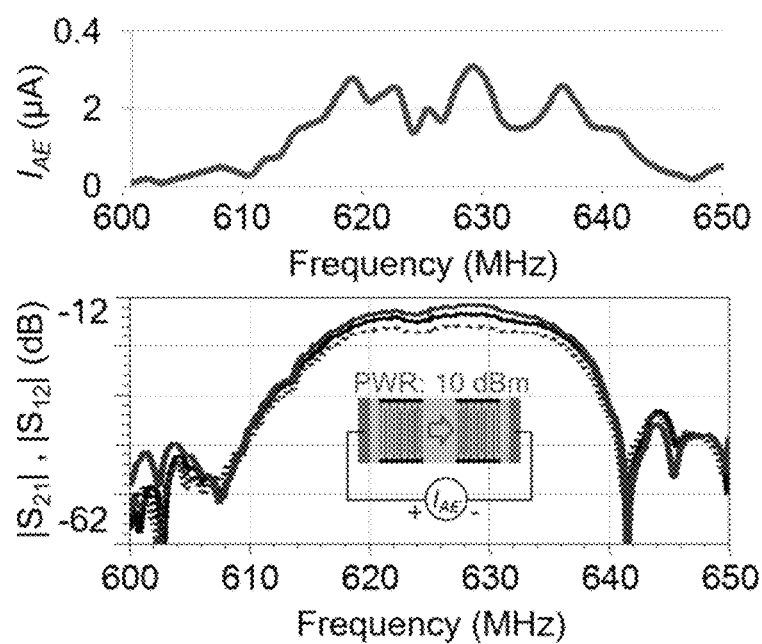
FIG. 18 depicts the current generated by the acoustic waves propagating in the device, according to an embodiment of the present disclosure.

A major implication of the AE amplification in this scheme is the selective amplification that applies almost exclusively to the pass band of the device. This is in stark contrast with the transistor based amplification scheme in which signal amplification occurs non-selectively or "blindly" and is only limited by gain x bandwidth product. In other words, only the acoustic modes supported by the device that meet the AE amplification criteria are amplified. This together with proper mode isolation techniques could enable amplification schemes in which signal-to-noise ratio (SNR) is preserved or even improved. FIG. 18 shows the generation of an AE current (IAE) almost exclusively within the device pass band which translates into the energy coupling between the drifting electrons and acoustic signals only at the pass band of the device. For this task, the RF port of the device is excited as the frequency is swept and the current generated by acoustic waves is recorded from the DC contacts. Generation of this AE current almost exclusively within the device pass band enables frequency selective amplification.

Another embodiment provides lithium niobate-on-silicon (LNoSi) non-reciprocal acoustic delay lines (ADL) with tunable insertion loss (IL) utilizing the acoustoelectric (AE) effect. Due to the AE effect, the direction- and the intensity-dependent momentum exchange between the drifting electrons in the Si layer and the acoustic phonons can be utilized to break the intrinsic reciprocity of the ADLs in order to control their frequency response. A 5.2 dB improvement in the IL and a 14.2 dB increase in the reverse isolation (e.g., a 19.4 dB non-reciprocal transmission ratio) is achieved through injecting a 400 μA current in one of the ADLs presented here. This opens up possibilities of merging long delays, tunable attenuators, and switches in a single miniaturized device which is a critical stepping stone in fulfillment of full-duplexed microwave systems.

While the revolution in electronics mainly relied on silicon (Si) and it continues to be driven by it, lithium niobate (LN) is playing the same role in the integrated photonic s field. As a result, hybrid electro-optic devices will likely be realized on LN on Si (LNoSi) heterogeneous platforms. Furthermore, due to its outstanding piezoelectric properties, LN has been long studied and employed in radio frequency (RF) acoustics for signal processing applications. More specifically, a great deal of research on the acoustoelectric (AE) phenomenon was fueled once LN-semiconductor heterostructures were preceded by piezoelectric semiconductor materials as the testbed for studying such phenomenon in the 1960s. The AE effect was initially observed in the form of the attenuation of acoustic phonons in an electron plasma as a result of the momentum transfer from former to latter; eventually, it was employed in surface acoustic wave (SAW) AE amplifiers by drifting electrons faster than the phase velocity of the acoustic waves (AW) in a manner similar to a travelling-wave-tube amplifier. However, limited fabrication capabilities at the time and subsequently devices with low efficiency discouraged many researchers from further investigations.

It was until recently that advances in wafer-level bonding enabled new demonstrations of the AE effect in heterogeneous SAW structures based on LN while our group demonstrated such effect in thin-film piezoelectric-on-Si (TPoS) Lamb wave resonators. The AE interactions in the latter comprises the piezoelectric coupling as well as the deformation potential, both of which contribute to the anharmonic electron bunching due to the stress in the piezoelectric film and Si layer, respectively. Utilizing such interactions in LNoSi platform enable realization of non-reciprocal Lamb wave acoustic delay lines (ADL) that concurrently allow for tuning the insertion loss (IL) and switching. In this scheme, the inherent reciprocity of such components is broken by the drifting electrons in the underlying Si layer; as it amplifies the signals (e.g., AW) propagating in its direction while attenuating those that propagate in the opposite direction. Such capabilities in a single miniaturized component facilitate the implementation of full-duplexed communications and mitigation of interference in the congested RF spectrum, both of which are essential to the 5G and beyond networks.

Figure 11:
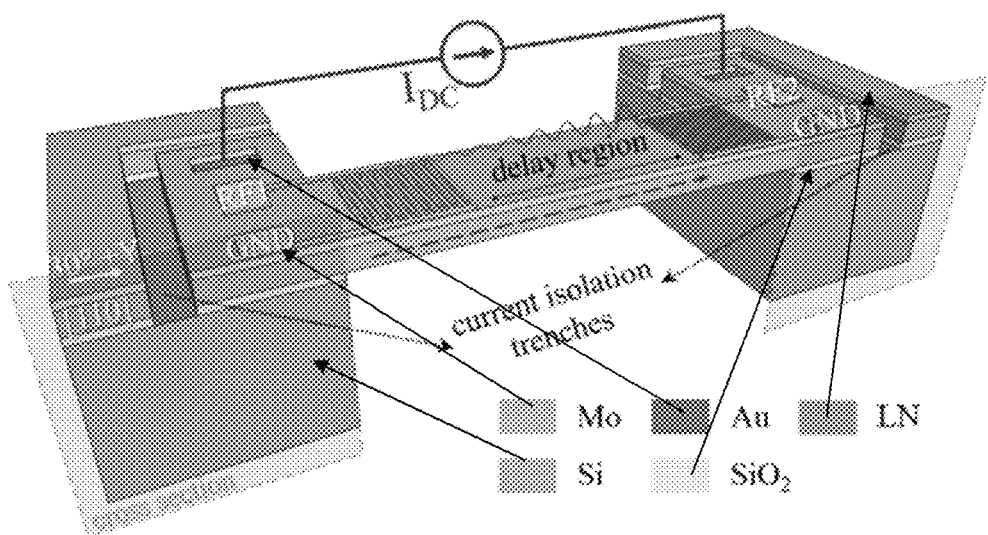
FIG. 11 illustrates a schematic of an embodiment having current injected in the Si layer, AE interactions result in non-reciprocity with respect to the direction of electron flow (dashed arrow), according to an embodiment of the present disclosure.

FIG. 11 illustrates a schematic of an embodiment having current injected in the Si layer, AE interactions result in non-reciprocity with respect to the direction of electron flow (dashed arrow).

In order to maximize the AE interactions, a high electromechanical coupling in conjunction with a low concentration of high mobility electrons is desired. To satisfy such conditions, an X-cut LN wafer is directly bonded to a lightly n-type doped 4-inch (100) SOI wafer. The $SiO_2$ layer of the SOI wafer acts as the sacrificial layer for forming the suspended device structure. The wafers are oriented so that the 30° off +y-axis plane of LN that is commonly known to offer the highest coupling for the symmetric Lamb waves is aligned to the [110] plane of the Si which allows for the highest electron mobility. The device structure is schematically displayed in FIG. 11. The device stack consists of 1 μm LN and 3 μm Si at a doping level of ~7E14 $cm^{-3}$.

Lamb waves are launched by means of 20 pairs of interdigital transducers (IDT) made of a 100 nm thick molybdenum (Mo) layer from one port (RF applied between FR1 and GND) and detected at the second port (RF read across RF2 and GND) after propagating through the delay region. By utilizing the lateral field excitation, the device structure may omit a bottom electrode. This allows for the strong penetration of the piezoelectrical coupled electrical fields into the Si layer and guarantees stronger AE interactions once a DC is applied to the Si layer via the Au overlaid contact points.

The IDT finger pitch, defined as the center to center distance between two consecutive electrodes, determines the center of the ADL pass-band and is chosen to be 5 μm in this non-limiting embodiment. The freedom in the IDT pattern which spatially maps the frequency pass band of the ADL can be used to accommodate a variety of pass band responses (e.g., narrow-band, wide-band). The length of the delay region determines the insertion delay (ID) as well as the amount of AE gain and non-reciprocity. Delay lengths of 200 μm (ADL200) and 400 μm (ADL400) are demonstrated below which respectively correspond to 30 ns and 60 ns real-time ID. Longer delay lengths correspond to longer real time delay, for instance a real time delay of −0.6 ns can be expected in a ADL having 4 mm of delay length.

Figure 12:
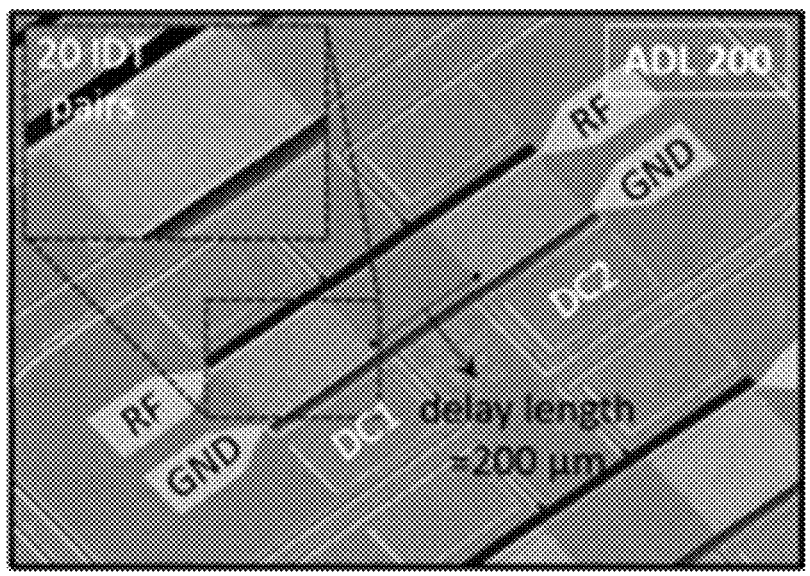
FIG. 12 depicts a SEM of ADL200 with its corresponding electrical connections; the inset shows the close up view of the IDTs having 5 μm finger pitch, according to an embodiment of the present disclosure.

The lateral boundary of the device is defined by etching the device stack which also restricts the current to pass only through the ADL. In-plane acoustic reflectors are incorporated in one of the configurations (ADL200R) to illustrate its effect. In order to pass current through the underlying Si, contacts are formed by etching the LN film and depositing gold (Au) and the ADL is suspended by etching the backside handle layer. The scanning electron micrograph (SEM) of a fabricated device and its IDT is shown in FIG. 12, a SEM of ADL200 with its corresponding electrical connections; the inset shows the close up view of the IDTs having 5 μm finger pitch.

The current values passing through the device are demonstrated since they directly impact the AE interactions. By doing so, the parasitic effects of non-Ohmic junctions between Au and lightly n-Si is mostly avoided.

Depending on the current intensity and direction, the propagating AWs can be attenuated or amplified along the ADL from one port to another with the AE gain (GAE) expression being as defined below:

$$G_{AE} = e^{\alpha L} \quad (4)$$

Where α is the incremental gain coefficient, and L is the device length. The incremental gain is generally expressed in the form as defined below:

$$\alpha/k_0 = \frac{K^2}{2} * \frac{\gamma\omega\tau}{1+(\gamma\omega\tau)^2} \quad (5)$$

Where $k_0$ and ω are the wavenumber and angular frequency, respectively, $K^2$ is the electromechanical coupling, γ is the relative difference between the electron drift velocity and AW phase velocity, and τ is a time constant that is determined by the conductivity and permittivity of the structure. It can be inferred from Equation (4) that the longer the ADL, the more AE gain and subsequently loss compensation is achievable. This directly translates to longer ID with lower IL; as the AE gain overcompensates for the propagation loss which has been reported to be ~1 dB $mm^{-1}$ in such class of LN ADLs while Si is a very low acoustic loss material, as well.

Figure 17:
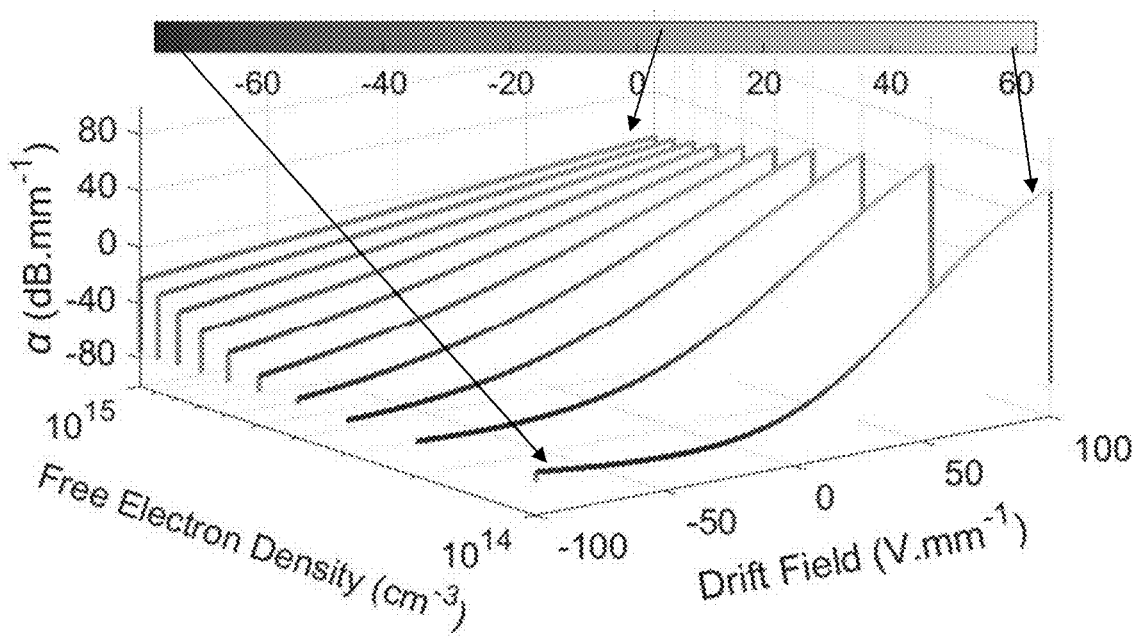
FIG. 17 depicts the analytical curves for the acoustoelectric amplification coefficient (a) for different values of the applied drift field and free carrier concentrations for the LNoSi ADL (such as shown in FIG. 11), according to an embodiment of the present disclosure.

FIG. 17 demonstrates the analytical curves for the acoustoelectric amplification coefficient (α) for different values of the applied drift field and free carrier concentrations for the LNoSi ADL, as shown in FIG. 11.

Figure 13:
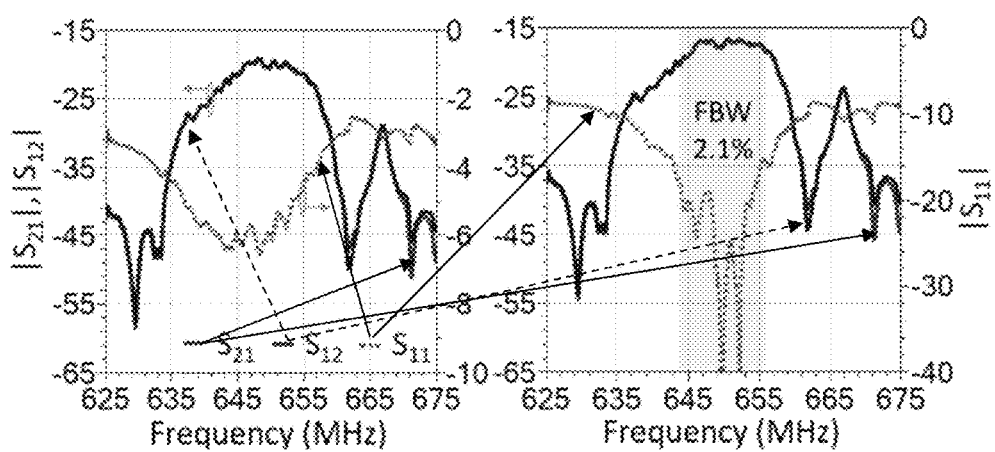
FIG. 13 depicts the frequency response of ADL200 measured prior to current injection (left) while the ports are terminated to 50Ω and (right) the terminations are conjugate match of the ports of the device, according to an embodiment of the present disclosure.

The devices are characterized at normal temperature and pressure by a vector network analyzer using ground signal ground (GSG) microprobes after performing on chip short-open-load-thru calibration to move the reference plane to the microprobe tips. Meanwhile, a pair of DC probes are used to feed the ADL with a voltage source with a controlled current ($I_{DC}$). FIG. 13 shows the measured frequency response (magnitude of the S-parameters) of ADL200 terminated to 50 Q (left) and a conjugately matched load (right) prior to passing $I_{DC}$. The ADL shows reciprocity and the fractional bandwidth (FBW) is measured to be 2.1% while the IL is 19.2 dB and 16.5 dB before and after performing the single stage low pass LC matching using the Keysight ADS software, respectively.

Figure 14:
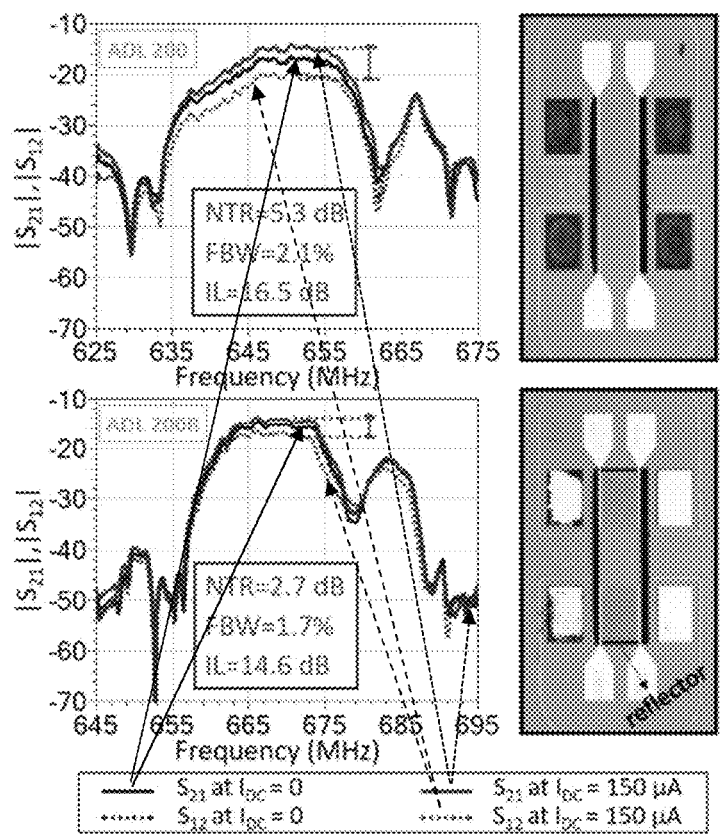
FIG. 14 the frequency response of ADL200 and ADL200R where the dark curves correspond to $I_{DC}=0$ μA and the grey ones to $I_{DC}=150$ μA; solid and dashed lines are respectively $S_{21}$ and $S_{12}$, according to an embodiment of the present disclosure.

FIG. 14 shows the frequency response of ADL200 and ADL200R where the dark curves correspond to $I_{DC}$=0 μA and the grey ones to $I_{DC}$=150 μA; solid and dashed liens are respectively $S_{21}$ and $S_{12}$.

Next, $I_{DC}$ is passed through the ADLs while their RF characteristics is measured. The IL is improved once the electron drift is in the same direction as the propagating RF signal while the reverse isolation is also enhanced due to the AE attenuation of backscattering waves. FIG. 14 compares the magnitude of $S_{21}$ and $S_{12}$ of the ADL200 and ADL200R before and after passing $I_{DC}$=150 μA through them. While the S21 and S12 overlap without passing the current, such amount of current results in a non-reciprocal transmission ratio (NTR=|$S_{21}$|/|$S_{12}$|) of 5.3 dB and 2.7 dB, respectively. Terminating the ADL with the acoustic reflector improves the IL at the expense of reducing the attainable NTR.

Figure 15:
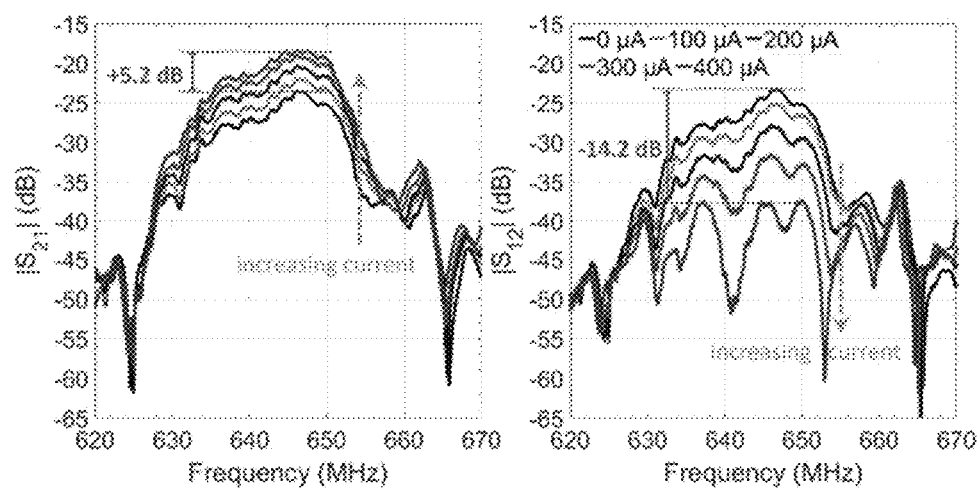
FIG. 15 depicts the frequency response ($|S_{21}|$ on the left and $|S_{12}|$ on the right) of ADL400 terminated to 50Ω for increasing the $I_{DC}$ from 0 μA to 400 μA, according to an embodiment of the present disclosure.
Figure 16:
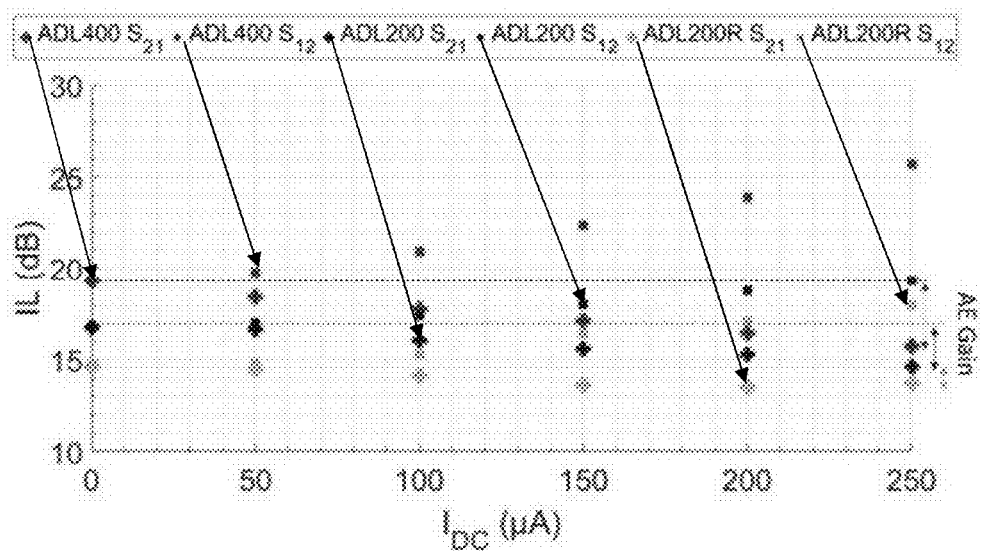
FIG. 16 depicts the IL measured from the peak $S_{21}$ and $S_{12}$ of different ADL types measured for different values of $I_{DC}$ showing a larger AE gain in ADL400, according to an embodiment of the present disclosure.

FIG. 15 shows the frequency response (|$S_{21}$| on the left and |$S_{12}$| on the right) of ADL400 terminated to 50Ω for increasing the $I_{DC}$ from 0 to 400 μA. The transmission and reverse isolation of ADL400 are shown as the injected current is increased. The IL and NTR of the ADL is tunable by changing the $I_{DC}$, yielding a 5.2 dB enhancement in the IL with a 19.4 dB of NTR at $I_{DC}$=400 μA Additionally, with reversing the current flow, the direction of the changes in the $S_{21}$ and $S_{12}$ is reversed and the ADL is virtually switched off at such current. The measured peak $S_{21}$ and $S_{12}$ of the devices studied herein for a current sweep from 0 to 250 μA is plotted in FIG. 16, confirming that a larger AE gain and NTR is achievable in the longer ADL.

An additional knob for fine-tuning the AE gain is available by applying a bias to the top IDTs and take advantage of the metal-insulator-semiconductor capacitor that is inherently formed in the disclosed structures. By applying the bias to the IDTs, the semiconductor layer (Si herein) can be depleted from charge carriers or accumulated. Such carrier density variations allow for adjusting the AE gain and non-reciprocity independent from the main bias voltage that is used for carrier drift. This additionally allows for compensating the variations of the carrier concentration from the values targeted in the design as a result of perturbations for example during the wafer bonding and/or etc.

By using the momentum exchange between the acoustic phonons and electrons, e.g., acoustoelectric effect (AE), in lithium niobate on silicon heterostructures, various embodiments can enable non-reciprocal Lamb wave acoustic delay lines (ADL) that can provide long delays with switching capabilities in a single miniaturized device. By passing a direct current through the lightly doped Si layer, the insertion loss (IL), reverse isolation, and non-reciprocal transmission ratio (NTR) of the AD Ls can be manipulated and at a constant current, a higher tuning range for the IL and NTR is achievable for longer devices.

The advantages set forth above, and those made apparent from the foregoing description, are efficiently attained. Since certain changes may be made in the above construction without departing from the scope of the invention, it is intended that all matters contained in the foregoing description or shown in the accompanying drawings shall be interpreted as illustrative and not in a limiting sense

INCORPORATION BY REFERENCE

All publications, patents, and patent applications mentioned in this specification are herein incorporated by reference to the same extent as if each individual publication, patent, or patent application was specifically and individually indicated to be incorporated by reference. To the extent publications and patents or patent applications incorporated by reference contradict the disclosure contained in the specification, the specification is intended to supersede and/or take precedence over any such contradictory material.

It is also to be understood that the following claims are intended to cover all of the generic and specific features of the invention herein described, and all statements of the scope of the invention which, as a matter of language, might be said to fall therebetween.

What is claimed is:

1. An apparatus for acoustoelectric amplification, the apparatus comprising:
   a thin piezoelectric layer;
   at least two radio frequency (RF) signal access ports (RF1 and RF2) communicatively coupled to the thin piezoelectric layer;
   a plurality of pairs of interdigital transducers (IDTs) arranged to facilitate excitement and detection of radio frequency signals;
   wherein at least one of the at least two RF signal access ports is configured to input RF signals, detect RF signals, or both within the thin piezoelectric layer;
   wherein the thin piezoelectric layer is configured with a lateral field excitation (LFE) electrode arrangement, the lateral electrode arrangement positioned to enhance acoustoelectric (AE) interactions between the piezoelectric field and an external applied voltage; and
   wherein LFE electrode arrangement is configured to support a traveling wave filter where RF signals propagate between input and output IDTs.

2. The apparatus of claim 1, further comprising a semiconductor layer bonded below the thin piezoelectric layer, whereby an acoustic heterostructure is formed.

3. The apparatus of claim 2, wherein the thin piezoelectric layer and the semiconductor layer have a total thickness which is less than the acoustic wavelength.

4. The apparatus of claim 2, further comprising at least two DC current coupling pads (DC1 and DC2) communicatively coupled to the semiconductor layer.

5. The apparatus of claim 4, wherein the at least two DC current coupling pads are configured to inject the DC current mainly in parallel with a direction of acoustic wave propagation in the semiconductor layer.

6. The apparatus of claim 1, wherein each of the plurality of pairs of IDTs is disposed on the thin piezoelectric layer forming the acoustic heterostructure, each of the plurality of pairs of IDTs being configured to excite and detect radio frequency signals within the acoustic heterostructure.

7. The apparatus of claim 6, wherein the plurality of pairs of IDTs are configured to result in unidirectional acoustic wave generation.

8. The apparatus of claim 6, wherein a physical distance forming a physical separation between a first input and a second output interdigital transducer pair of the plurality of pairs of interdigital transducers define at least one acoustic delay line (ADL) within the acoustic heterostructure.

9. The apparatus of claim 2, wherein the semiconductor layer has large free carrier mobility.

10. The apparatus of claim 2, wherein the thin piezoelectric layer has large piezoelectric coupling.

11. The apparatus of claim 6, wherein the plurality of pairs of IDTs comprise a metallic layer with a thickness much smaller than the acoustic wavelength.

12. The apparatus of claim 6, wherein the plurality of pairs of IDTs have a periodicity that defines the acoustic wavelength and passband frequency.

13. The apparatus of claim 6, wherein the plurality of pairs of IDTs are separated by a physical distance defining a delay region, forming a traveling wave filter.

14. The apparatus of claim 6, wherein the apparatus is configured to receive a voltage to change a carrier concentration in at least one portion of the semiconductor layer.

15. An apparatus for acoustoelectric amplification, the apparatus comprising:
    a semiconductor layer;
    at least two access pads communicatively coupled to the semiconductor layer, the at least two access pads being positioned at opposite ends of the apparatus, wherein the at least two access pads are configured to provide an asymmetric drift current profile across a defined acoustic wave propagation path of the semiconductor layer, ensuring a controlled variation in carrier properties;
    a structured electrode arrangement configured to modulate carrier drift velocity relative to the acoustic wave propagation direction;
    wherein at least one of the at least two access pads is positioned in a manner to receive a voltage, current, or both to change a charge carrier property in at least one portion of the semiconductor layer, whereby the positioning of at least one of the at least two access pads causes an electron drift within the charge injection region to be asymmetrical, producing a non-reciprocal signal amplification effect.

16. The apparatus of claim 15, further comprising:
    a thin piezoelectric layer disposed adjacent to the semiconductor layer, whereby an acoustic heterostructure is formed; and
    at least two radio frequency (RF) signal access ports disposed about at least a portion of the acoustic heterostructure, wherein at least one of the at least two radio frequency (RF) signal access ports is electrically isolated from at least one of at least two access pads communicatively coupled to the semiconductor layer.

17. The apparatus of claim 16, wherein the thin piezoelectric layer and the semiconductor layer have a total thickness which is less than the acoustic wavelength.

18. The apparatus of claim 16, wherein the at least two access pads are configured to inject a DC current mainly in parallel with a direction of acoustic wave propagation in the semiconductor layer.

19. The apparatus of claim 18, wherein the at least two access pads are configured to inject the DC current into at least one acoustic delay line (ADL) within the acoustic heterostructure.

20. A method for producing an apparatus for acoustoelectric amplification, the method comprising:
  providing a semiconductor layer;
  disposing a thin piezoelectric layer onto the semiconductor layer, thereby forming an acoustic heterostructure;
  communicatively coupling at least two radio frequency (RF) signal access ports (RF1 and RF2) to the thin piezoelectric layer, wherein at least one of the at least two RF signal access ports allow for forming a lateral field excitation (LFE) electrode arrangement, wherein the LFE electrode arrangement enhances acoustoelectric interactions between charge carriers and propagating acoustic waves; and
  communicatively coupling at least two DC signal access ports (DC1 and DC2) to the semiconductor layer, wherein at least one of the at least two DC signal access ports allow an externally applied DC current to induce electron drift within the charge carrier injection region; and
  configuring the semiconductor layer such that the acoustoelectric interactions enable a non-reciprocal gain mechanism dependent on the relative direction of electron drift and acoustic wave propagation.

* * * * *